(12) United States Patent
Ye

(10) Patent No.: US 9,363,909 B2
(45) Date of Patent: Jun. 7, 2016

(54) POSITIONING AND ADJUSTING DEVICE OF DISPLAY

(71) Applicant: Maoqing Ye, Fuzhou (CN)

(72) Inventor: Haiying Ye, Fuzhou (CN)

(73) Assignee: Maoqing Ye, Fuzhou (CN)

( * ) Notice: Subject to any disclaimer, the term of this patent is extended or adjusted under 35 U.S.C. 154(b) by 0 days.

(21) Appl. No.: 14/766,748

(22) PCT Filed: Dec. 18, 2013

(86) PCT No.: PCT/CN2013/089832
§ 371 (c)(1),
(2) Date: Aug. 9, 2015

(87) PCT Pub. No.: WO2015/085609
PCT Pub. Date: Jun. 18, 2015

(65) Prior Publication Data
US 2015/0382491 A1  Dec. 31, 2015

(30) Foreign Application Priority Data

Dec. 10, 2013  (CN) .......................... 2013 1 0661260

(51) Int. Cl.
| A47G 1/24 | (2006.01) |
| H05K 5/02 | (2006.01) |
| F16M 11/04 | (2006.01) |
| F16M 11/10 | (2006.01) |
| F16M 11/22 | (2006.01) |
| F16M 11/20 | (2006.01) |

(52) U.S. Cl.
CPC ........... *H05K 5/0234* (2013.01); *F16M 11/046* (2013.01); *F16M 11/10* (2013.01); *F16M 11/2021* (2013.01); *F16M 11/22* (2013.01); *H05K 5/02* (2013.01); *H05K 5/0226* (2013.01); *F16M 2200/044* (2013.01); *F16M 2200/047* (2013.01)

(58) Field of Classification Search
USPC .................................... 248/457, 918; 361/681
See application file for complete search history.

(56) References Cited

U.S. PATENT DOCUMENTS

| 7,068,497 | B2 * | 6/2006 | Chu ...................... F16M 11/046 248/919 |
| 7,370,838 | B2 * | 5/2008 | Jeong ...................... F16C 11/10 248/125.7 |

(Continued)

FOREIGN PATENT DOCUMENTS

| CN | 201045705 Y | 4/2008 |
| CN | 201954217 U | 8/2011 |

(Continued)

*Primary Examiner* — Monica Millner
(74) *Attorney, Agent, or Firm* — Gokalp Bayramoglu

(57) ABSTRACT

The present invention provides a positioning and adjusting device of the monitor, comprising a supporting frame, the main body of the monitor is installed on a supporting frame in an inclined way, the rear seat is hinged to the upper end of the supporting frame, the display panel is in sliding connection with the rear seat; a convex part is disposed on the backside and extended into the inner cavity of the rear seat, a convex pin is disposed next to the side of the convex part, and a hook is set on the inner cavity of the rear seat that makes the display panel in a downward positioning status, when the convex pin is moving upward along the display panel. The device can adjust the vertical position of the display panel and adjust the tilt angle of the display panel to meet the watching needs of consumers.

6 Claims, 4 Drawing Sheets

(56) References Cited

U.S. PATENT DOCUMENTS

| | | | | |
|---|---|---|---|---|
| 7,497,408 B2* | 3/2009 | Lim | ............... | F16M 11/04 248/123.11 |
| 7,513,011 B2* | 4/2009 | Lu | ............... | G06F 1/1601 16/337 |
| 7,604,206 B2* | 10/2009 | Jung | ............... | F16M 11/046 16/340 |
| 7,628,365 B2* | 12/2009 | Lee | ............... | F16M 11/04 248/282.1 |
| 7,677,509 B2* | 3/2010 | Jang | ............... | F16M 11/04 248/121 |
| 7,775,487 B2* | 8/2010 | Hu | ............... | F16M 11/26 248/157 |
| 7,789,363 B2* | 9/2010 | Duan | ............... | F16M 11/10 248/123.11 |
| 7,854,417 B2* | 12/2010 | Gan | ............... | F16M 11/24 248/122.1 |
| 8,033,513 B2* | 10/2011 | Jang | ............... | F16M 11/04 248/122.1 |
| 8,052,102 B2* | 11/2011 | Hu | ............... | F16M 11/046 248/157 |
| 8,199,473 B2* | 6/2012 | Zhou | ............... | F16M 11/10 248/917 |
| 8,733,716 B2* | 5/2014 | Li | ............... | F16M 11/041 248/188 |
| 8,944,396 B2* | 2/2015 | Mau | ............... | E05D 3/12 248/274.1 |
| 8,967,569 B2* | 3/2015 | Hsu | ............... | F16M 11/10 16/233 |
| 2003/0075649 A1* | 4/2003 | Jeong | ............... | F16M 11/105 248/157 |
| 2005/0051693 A1 | 3/2005 | Chu | | |
| 2006/0187625 A1* | 8/2006 | Jung | ............... | G06F 1/1601 361/679.06 |
| 2006/0238966 A1* | 10/2006 | Sung | ............... | F16M 11/04 361/679.05 |
| 2007/0152125 A1* | 7/2007 | Lee | ............... | F16M 11/04 248/398 |
| 2007/0262210 A1* | 11/2007 | Oh | ............... | F16M 11/10 248/125.1 |
| 2008/0302926 A1* | 12/2008 | Cheng | ............... | F16M 11/105 248/161 |
| 2009/0189048 A1 | 7/2009 | Gan et al. | | |
| 2010/0187374 A1 | 7/2010 | Hu | | |
| 2010/0327136 A1* | 12/2010 | Papic | ............... | F16M 11/046 248/288.11 |
| 2012/0248048 A1* | 10/2012 | Wu | ............... | F16M 11/10 211/26 |
| 2013/0271901 A1* | 10/2013 | Lin | ............... | H05K 5/0226 361/679.01 |
| 2013/0320160 A1* | 12/2013 | Chiang | ............... | F16M 11/2021 248/121 |
| 2014/0063750 A1* | 3/2014 | Mau | ............... | G06F 1/1601 361/728 |
| 2015/0102185 A1* | 4/2015 | Ho | ............... | F16M 11/22 248/121 |

FOREIGN PATENT DOCUMENTS

| | | |
|---|---|---|
| CN | 203641788 U | 6/2014 |
| WO | WO2008004759 A2 | 1/2008 |

* cited by examiner

POSITIONING AND ADJUSTING DEVICE OF DISPLAY

TECHNICAL FIELD

The present invention relates to a monitor positioning and adjusting device.

TECHNICAL BACKGROUND OF THE INVENTION

The monitor as a display device is widely used in real life, especially in the workplace. With the development of science and technology, the touch monitor may become a trend for the future development of the monitor, and it has been expanding its market. When the customers using the monitor; especially a touch monitor, you should often show the contents of the display panel to the customers, or demonstrate how to operate the display panel. However, the existing rotation radian of the display panel of a touch monitor is small, the operator needs to rotate the display panel along with the base plate in order to show others the content of the display panel. After rotation, the display panel is not suitable for operation and is not conducive to watch, it is very inconvenience.

SUMMARY OF THE INVENTION

The purpose of the present invention is to provide a positioning and adjusting device of the monitor; the device can not only adjust the vertical position of the display panel, but can also adjust the tilt angle of the display panel, in order to meet the watching needs of consumers.

The technical proposal of the invention is a positioning and adjusting device of the monitor, comprising a supporting frame, wherein the main body of the monitor is installed on a supporting frame in an inclined way, the rear seat of the main body of the monitor is hinged to the upper end of the supporting frame, the display panel of the monitor is in sliding connection with the rear seat; wherein a convex part is disposed on the backside of the display panel of the monitor and extended into the inner cavity of the rear seat, a convex pin is disposed next to the side of the convex part, and a hook for catching the convex pin is set on the inner cavity of the rear seat so that it can make the display panel of the monitor in a downward positioning status, when the convex pin is moving upward along the display panel of the monitor, the hook under its gravitational force will be in a backward deflection to lift restrictions on the convex pin.

Further, a lower end of the supporting frame is embedded in a base plate, an upper end of the supporting frame is installed with two brackets, the brackets are parallel with each other, the brackets are respectively provided with a longitudinal hole to allow a mandrel through the brackets, and each longitudinal hole in the brackets fit in with the mandrel.

Further, the backside of the display panel of the monitor connects with a groove board, two side plates of the groove board are respectively connected to a sliding rail, and a sliding block moving along the longitudinal direction of the sliding rail is embed into the inner of the sliding rail, and the convex part extending into the inner cavity of the rear seat is set on the backside of the groove board.

Further, the rear seat is consisted of two pieces of bent plywood and a slot type frame, the slot type frame is connected to the inner bent portion of the pieces of bent plywood, and a connecting plate belonging to the pieces of bent plywood and located on the backside of the pieces of bent plywood is provided with through-holes corresponding to the mandrel, the mandrel pass through the longitudinal holes, the pieces of bent plywood by the through-holes and a limiting, sleeve located between the two pieces of bent plywood, pieces of the bent plywood and the limiting sleeve are hinged to the two brackets.

Further, a constant force springs is hinged between the two pieces of bent plywood and the front side of the limiting sleeve, a leading-out end of the constant force spring is connected to the lower end of the display panel.

Further, the constant force spring set in a spindle located in the front side of the limiting sleeve and also between the two pieces of bent plywood.

Further, the sliding block located in the sliding rail is connected next to the side of the pieces of bent plywood to realize the sliding connection of the display panel and rear seat; wherein a hook for catching the convex pin is disposed between the two slot type frames so that it can make the display panel in a downward positioning status.

Further, a supporting sleeve is set at the end of the mandrel located next to the two sides of the brackets, and a torsion spring is set in the supporting sleeve, one end of the torsion spring is matched with the brackets, the other end of the torsion spring is arranged to match with a fixing piece set in the head of the mandrel.

Compared with the prior art, the invention has the following advantages: the device provided by the invention not only has a large rotational angle of the display panel, which makes it convenient for the user to show others the contents of the display panel and easy to watch, but also allows the display panel to slide up and down to adjust to different positions without actually moving the position of the monitor, when the display panel of the device is underling a downward pressure, it also has a self-locking function to prevent the bottom of the display panel from hitting the desktop and protects the screen from damage.

DETAILED DESCRIPTION OF THE PREFERRED EMBODIMENT

To make the above-mentioned features and advantages of the invention become apparent, especially cite an embodiment below and provide the accompanying drawings to describe in detail below, but the present invention is not limited to this.

Figure 1:
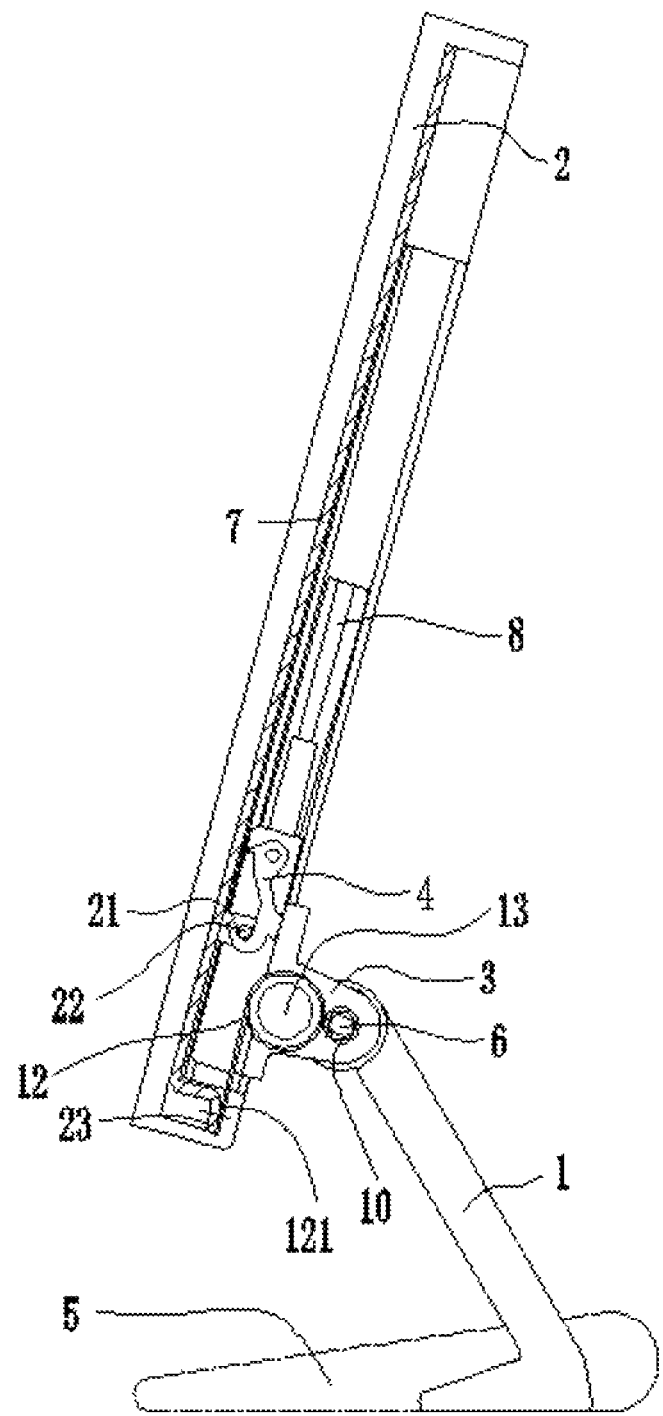
FIG. 1 is a structure illustration of an embodiment of the present invention.
Figure 2:
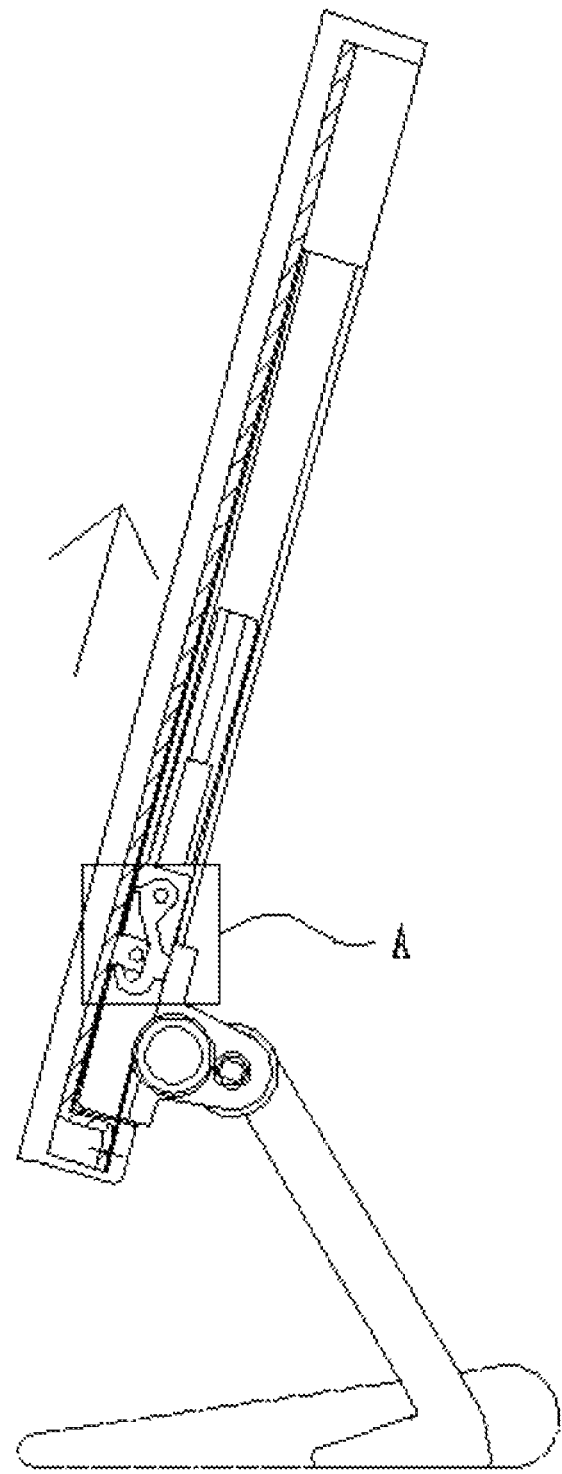
FIG. 2 is a state chart illustration of an embodiment of the upward moving display panel
Figure 3:
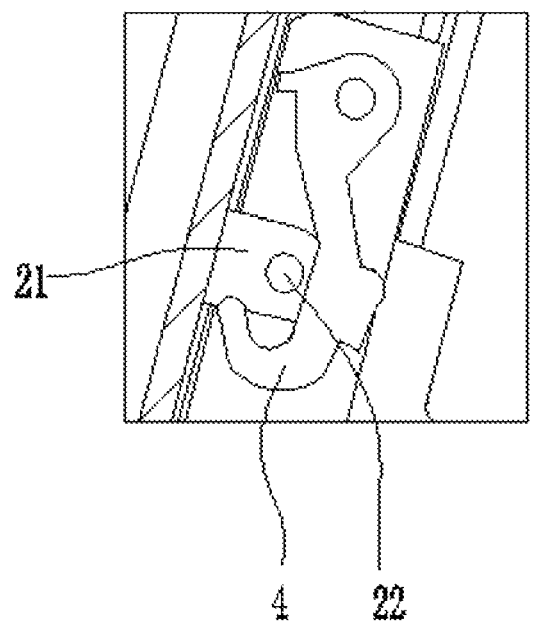
FIG. 3 is an enlarged illustration of an embodiment of intra-area A of FIG. 2.
Figure 4:
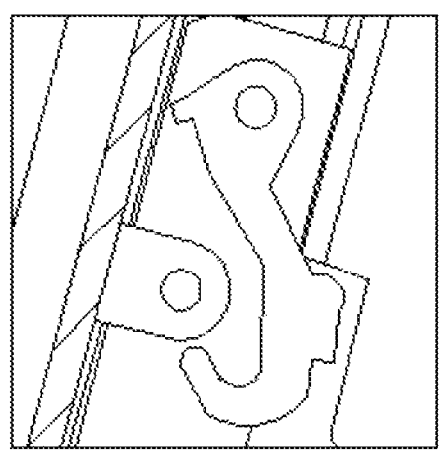
FIG. 4 is a state chart illustration of an embodiment of the downward swing hook.
Figure 5:
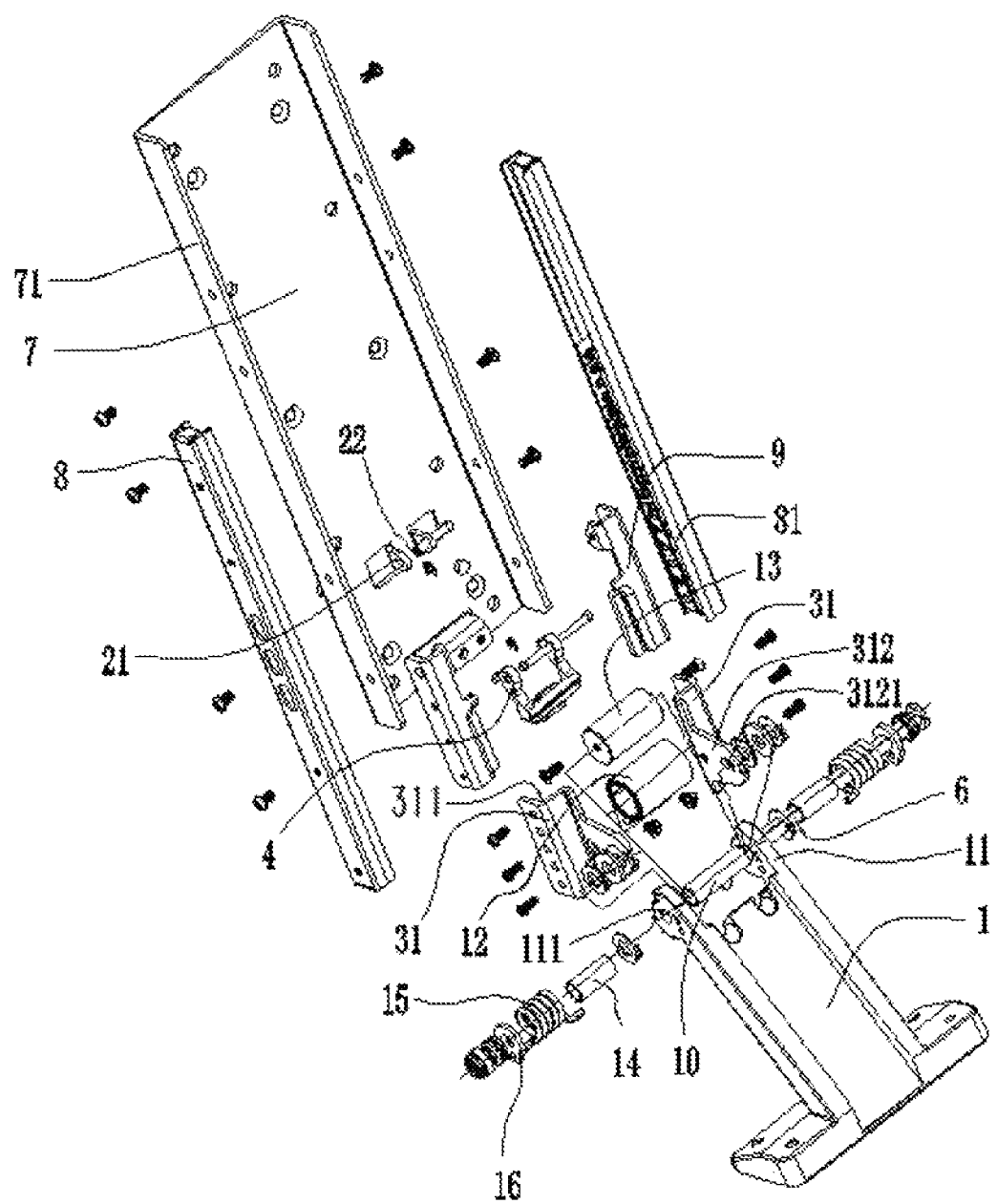
FIG. 5 is an exploded state illustration of an embodiment of the present invention.

Referring to FIGS. 1-5, an embodiment of a monitor positioning and adjusting device, comprising supporting frame 1, wherein a main body of the monitor is installed on supporting frame 1 in an inclined way, rear seat 3 of the main body of the monitor is hinged to the upper end of supporting frame 1, display panel 2 of the monitor is in sliding connection with rear seat 3; wherein convex part 21 is disposed on the backside of display panel 2 of the monitor and extended into the inner cavity of rear seat 3, convex pin 22 is disposed next to the side of convex part 21, and hook 4 for catching on convex pin 22, which is set on the inner cavity of rear seat 3 so that it can display panel 2 of the monitor in a downward positioning status, when convex pin 22 is moving upward along display panel 2 of the monitor, hook 4 under its gravitational force will be in a backward deflection to lift restrictions on convex pin 21.

In this embodiment, in order to fix supporting frame 1, the lower end of supporting frame 1 is embedded in base plate 5, and in order to fix mandrel 6, the upper end of supporting frame 1 is installed with two brackets 11, brackets 11 are parallel with each other, and brackets 11 are respectively provided with longitudinal hole 111 to allow mandrel 6 through brackets 11, and each longitudinal hole 111 in brackets 11 is coaxial and fits in with mandrel 6.

In this embodiment, in order to fasten the other construction members of the monitor, the backside of display panel 2 of the monitor connects with groove board 7, the two side plates of groove board 7 are respectively connected to sliding rail 8, and sliding block 81 moves along the longitudinal direction of sliding rail 8 is embed into the inner of sliding rail 8, and convex part 21 extending into the inner cavity of rear seat 3 is set on the backside of groove board 7.

In this embodiment, rear seat 3 is consisted of two pieces of bent plywood 31 and slot type frame 9, the slot type frame 9 is connected to the inner bent portion 111 of the pieces of bent plywood 9, and connecting plate 312 belonging to the pieces of bent plywood 31 and located on the backside of the pieces of bent plywood 31 is provided with through-holes 3121 corresponding to the mandrel, the mandrel pass through longitudinal holes 111, the pieces of bent plywood 31 by through-holes 3121 and limiting sleeve 10 located between the two pieces of bent plywood 31, the pieces of bent plywood 31 and limiting sleeve 10 are hinged to the two brackets 11, in order to make the pieces of bent plywood 31 rotate around mandrel 6.

In this embodiment, in order to make the display panel achieve accurate positions without slipping when display panel 2 is sliding, constant force springs 12 is hinged between the two pieces of bent plywood 31 and the front side of limiting sleeve 10, leading-out end 121 of constant force spring 12 is connected to the lower end of display panel 121, it ensure that display panel 2 can achieve accurate positioning by the action of constant force springs 12 when display panel 2 is stopping after sliding up and down.

In this embodiment, in order to reduce the wear and improve the service life of constant force spring 12, to make constant force spring 12 set in spindle 13, which is located in the front side of limiting sleeve 10 and also between the two pieces of bent plywood 31.

In this embodiment, the sliding block located in sliding rail 8 is connected next to the side of the pieces of bent plywood 31 to realize the sliding connection of display panel 2 and rear seat 3; hook 4 for catching convex pin 22 is disposed between two slot type frames 9 so that it can make the display panel 2 in a downward positioning status.

In this embodiment, in order to reduce the degree of the wear of the mandrel, supporting sleeve 14 is set at the end of mandrel 6 located next to the two sides of brackets 11, and torsion spring 15 is set in supporting sleeve 14, one end of torsion spring 15 is to match with brackets 11, the other end of torsion spring 15 is arranged to match with fixing piece 16 set in the head of mandrel 6, so that display panel 2 can rotate around spindle 13.

In this embodiment, to define the horizontal axis as the X-axis, and define the vertical axis of display panel 2 under the vertical state as the Y-axis panel. The display panel 2 of the monitor is fastened by hook 4 and cannot slide down when rotating from 5° forward to 12° backward around supporting frame 1. In order to let display pane 2 slid, it must be rotated backwards greater than 15°, and put display panel 2 obliquely upward to the apex, then hook 4 will swing down naturally because Of its gravity, which makes hook 4 out of convex pin 22 so that display panel 2 can slide up and down. In order to lock display panel 2, first one must rotate display panel 2 between 5° forward to 12° backward around supporting frame 1, then put display panel 2 upward, at that time hook 4 will swing down naturally under its gravity, then put down display panel 2 to let it to be fastened by hook 4 so that display panel 2 cannot slide. In this invention, display panel 2 can rotate around supporting frame 1, and display panel 2 cannot slide down when it is rotated between 5° forward to 25° backward, but when display panel 2 is rotated 55° backward, it is easy to slide down and can conduct as a Touch Computer.

The foregoing is only preferred embodiments of the present invention, those of ordinary skill in the an can design different forms of the positioning and adjusting device of the monitor, but do not need to any creative labor on the basis on the content of this invention. Without departing from the principles and technology of the invention, the equality of ever y change, modifications, substitutions and variations made under the scope of the invention patent applications, also belong to the scope of the invention.

The invention claimed is:

1. A positioning and adjusting device of a monitor, comprising a supporting frame,
   wherein a main body of the monitor is installed on the supporting frame in an inclined way, a rear seat of the main body of the monitor is hinged to an upper end of the supporting frame, a display panel of the monitor is in sliding connection with the rear seat;
   wherein a convex part is disposed on a backside of the display panel of the monitor and extended into an inner cavity of the rear seat, a convex pin is disposed next to a side of the convex part, and a hook for catching on the convex pin is set on the inner cavity of the rear seat so that it can make the display panel of the monitor in a downward positioning status;
   wherein when the convex pin is moving upward along the display panel of the monitor, the hook under its gravitational force will be in a backward deflection to lift restrictions on the convex pin;
   wherein a lower end of the supporting frame is embedded in a base plate, an upper end of the supporting frame is installed with two brackets, the brackets are parallel with each other, and the brackets are respectively provided with a longitudinal hole to allow a mandrel through the brackets, and the each longitudinal hole in the brackets does fit in with the mandrel;
   wherein the rear seat consist of two pieces of bent plywood and a slot type frame, the slot type frame is connected to an inner bent portion of the pieces of bent plywood, and a connecting plate belonging to the pieces of bent plywood and located on a backside of the pieces of bent plywood is provided with through-holes corresponding to a mandrel, and the mandrel passes through a plurality of longitudinal holes, pieces of bent plywood by the through-holes and a limiting sleeve located between the two pieces of bent plywood, the pieces of bent plywood and the limiting sleeve are hinged to two parallel brackets.

2. The positioning and adjusting device of the monitor according to claim 1, wherein the backside of the display panel of the monitor connects with a groove board, two side plates of the groove board are respectively connected to a sliding rail, and a sliding block moving along a longitudinal direction of the sliding rail is embed into an inner of the sliding rail, and the convex part extending into the inner cavity of the rear seat is set on a backside of the groove board.

3. The positioning and adjusting device of the monitor according to claim 1, wherein a constant force springs is hinged between the two bent plywood and a front side of the limiting sleeve, a leading-out end of the constant force spring is connected to a lower end of the display panel.

4. The positioning and adjusting device of the monitor according to claim 3, wherein the constant force spring set in a spindle located in the front side of the limiting sleeve and also between the two pieces of bent plywood.

5. The positioning and adjusting device of the monitor according to claim 1, wherein the sliding block located into the sliding rail is connected next to a side of the pieces of bent plywood to realize the sliding connection of the display panel and the rear seat;

wherein a hook for catching on the convex pin is disposed between the two slot type frames so that it can make the display panel in a downward positioning status.

6. The positioning and adjusting device of the monitor according to claim 1, wherein a supporting sleeve is set in end of the mandrel located next to two sides of the brackets, and a torsion spring is set in the supporting sleeve, one end of the torsion spring is matched with the brackets, the other end of the torsion spring is arranged to match with a fixing piece set in a head of the mandrel.

* * * * *